(12) United States Patent
Van Herwijnen et al.

(10) Patent No.: US 7,893,154 B2
(45) Date of Patent: Feb. 22, 2011

(54) RENEWABLE BINDER FOR NONWOVEN MATERIALS

(75) Inventors: Hendrikus W. G. Van Herwijnen, Hausleiten-Goldgeben (AT); Elena Pisanova, Mississauga (CA); Barbara Stefke, St. Pölten (AT)

(73) Assignee: Dynea Oy, Helsinki (FI)

( * ) Notice: Subject to any disclaimer, the term of this patent is extended or adjusted under 35 U.S.C. 154(b) by 29 days.

(21) Appl. No.: 11/933,704

(22) Filed: Nov. 1, 2007

(65) Prior Publication Data

US 2008/0108741 A1    May 8, 2008

Related U.S. Application Data

(60) Provisional application No. 60/864,253, filed on Nov. 3, 2006.

(51) Int. Cl.
  *C09D 103/06* (2006.01)
(52) U.S. Cl. .................. 525/54.3; 525/54.31
(58) Field of Classification Search .......... 525/54.3, 525/54.31
See application file for complete search history.

(56) References Cited

U.S. PATENT DOCUMENTS

| | | | |
|---|---|---|---|
| 3,630,831 A | 12/1971 | Jongetjes | |
| 4,076,917 A | 2/1978 | Swift et al. | |
| 4,537,807 A | 8/1985 | Chan et al. | |
| 4,625,029 A | 11/1986 | Floyd et al. | |
| 4,656,296 A | 4/1987 | Floyd | |
| 4,695,606 A | 9/1987 | Floyd et al. | |
| 4,780,339 A * | 10/1988 | Lacourse et al. | 427/389.7 |
| 5,006,140 A | 4/1991 | Loercks et al. | |
| 5,143,582 A | 9/1992 | Arkens et al. | |
| 5,354,803 A | 10/1994 | Dragner et al. | |
| 5,840,787 A | 11/1998 | West et al. | |
| 5,919,716 A | 7/1999 | Raynolds et al. | |
| 5,932,689 A | 8/1999 | Arkens et al. | |
| 6,042,630 A | 3/2000 | de Groot | |
| 6,183,531 B1 | 2/2001 | De Groot et al. | |
| 6,221,973 B1 | 4/2001 | Arkens et al. | |
| 6,331,350 B1 | 12/2001 | Taylor et al. | |
| 6,379,499 B1 | 4/2002 | Yang et al. | |
| 6,444,750 B1 | 9/2002 | Touhsaent | |
| 6,482,876 B1 | 11/2002 | Witt-Nuesslein et al. | |
| 6,562,267 B1 | 5/2003 | Hansen et al. | |
| 6,699,945 B1 | 3/2004 | Chen et al. | |
| 6,884,849 B2 | 4/2005 | Chen et al. | |
| 6,960,627 B2 | 11/2005 | Huth et al. | |
| 2003/0008586 A1 | 1/2003 | Kajander et al. | |
| 2004/0122166 A1 * | 6/2004 | O'Brien-Bernini et al. | 525/54.31 |
| 2004/0167260 A1 | 8/2004 | Chen et al. | |
| 2004/0254285 A1 * | 12/2004 | Rodrigues et al. | 524/494 |

FOREIGN PATENT DOCUMENTS

| | | |
|---|---|---|
| CA | 2 507 646 A1 | 9/2004 |
| EP | 0 255 859 A1 | 2/1988 |
| EP | 0 631 466 B1 | 7/1996 |
| EP | 1 486 547 A2 | 12/2004 |
| GB | 1 336 426 | 11/1973 |
| JP | 4-139236 A | 5/1992 |
| WO | WO-92/19095 A1 | 11/1992 |
| WO | WO-97/07664 A1 | 3/1997 |
| WO | WO-03/104284 A2 | 12/2003 |
| WO | WO-2006/120523 A1 | 11/2006 |

OTHER PUBLICATIONS

Polyvinyl Alcohol Chemical and Technical Assessment, S.K. Saxena, 61st JECFA 2004 p. 1.
Tautomerism: http://www.britannica.com/EBchecked/topic/13527/aldehyde/277603/Tautomerism; Encyclopedia Britannica, 2009.
Chen et al., Journal of Environmental Polymer Degradation, vol. 5, No. 2, pp. 111-117 (1997).
Park et al., Journal of Polymers and the Environment, vol. 13, No. 4, pp. 375-382 (2005).

* cited by examiner

*Primary Examiner*—Kelechi C Egwim
(74) *Attorney, Agent, or Firm*—Birch, Stewart, Kolasch & Birch, LLP

(57) ABSTRACT

A formaldehyde-free curable aqueous composition comprising an adduct of (a) carbohydrate polymer and (b) a multifunctional crosslinking agent such as a polybasic acid may be used as a binder for non-woven products such as fiberglass insulation.

20 Claims, No Drawings

RENEWABLE BINDER FOR NONWOVEN MATERIALS

This Nonprovisional application claims priority under 35 U.S.C. §119(e) on U.S. Provisional Application No. 60/864,253 filed on Nov. 3, 2006, the entire contents of which are hereby incorporated by reference.

FIELD OF THE INVENTION

This invention relates to a non-formaldehyde binder for non-woven products such as fiberglass insulation. More particularly, the invention pertains to thermosetting self-crosslinking resins comprising an infinitely water-dilutable aqueous solution of a carbohydrate polymer together with a multi-functional crosslinking agent.

BACKGROUND OF THE INVENTION

Fiberglass insulation products consist of glass fibers bonded together with covalently crosslinked binder resins. Processes for making fiberglass insulation generally include drawing molten streams of glass to spinning wheels where they are spun into thin fibers by centrifugal forces. The fibers are then blown into a forming chamber, sprayed with an aqueous binder and deposited as a mat onto a traveling conveyor. Thereafter, the coated mat is transferred to a curing oven where heated air is blown through the mat to cure the binder and rigidly bond the glass fibers together.

Fiberglass binders used in the present sense should not be confused with matrix resins which are an entirely different and non-analogous field of art. While sometimes termed "binders," matrix resins act to fill the entire interstitial space between fibers, resulting in a dense, fiber reinforced product where the matrix must translate the fiber strength properties to the composite, whereas "binder resins" as used herein are not space-filling, but rather coat only the fibers, and particularly the junctions of fibers. Fiberglass binders also cannot be equated with paper or wood product "binders" where the adhesive properties are tailored to the chemical nature of the cellulosic substrates. Many such resins, e.g. urea/formaldehyde and resorcinol/formaldehyde resins, are not suitable for use as fiberglass binders. One skilled in the art of fiberglass binders would not look to cellulosic binders to solve any of the known problems associated with fiberglass binders.

Binders useful in fiberglass insulation products generally require a low viscosity in the uncured state, and yet have the characteristic ability to form a rigid thermoset polymeric mat with the glass fibers when cured. A low binder viscosity in the uncured state allows the mat to be sized correctly. Also, viscous binders tend to be tacky or sticky and hence they lead to accumulation of fiber on the forming chamber walls. This accumulated fiber may later fall onto the mat causing dense areas and product problems. A binder which forms a rigid matrix when cured is desired so that a finished fiberglass thermal insulation product, when compressed for packaging and shipping, will recover to its specified vertical dimension when installed in a building.

Phenol-formaldehyde (PF) resins, as well as PF resins extended with urea, are widely used throughout the fiberglass insulation industry. Such resins are inexpensive, have low viscosity, and cure to form a rigid polymer, thereby providing the finished product with excellent physical properties.

A serious disadvantage of PF resins is the high concentration of free formaldehyde, which is normally partially scavenged with urea. During the curing reaction, formaldehyde and low molecular weight phenol-formaldehyde compounds are volatilized from the binder into the surrounding environment. Therefore, there is a continuing need for alternative fiberglass binder that would not emit formaldehyde upon curing.

A number of formaldehyde-free compositions have been developed for use as a binder for making fiberglass insulation products.

U.S. Pat. No. 4,076,917 discloses the use of beta-hydroxyalkylamides to cure polycarboxy polymers such as polyacrylic acid. Such a system, however, is too viscous for use as a binder for glass fibers.

U.S. Pat. Nos. 6,221,973 and 6,331,350 describe a formaldehyde-free fiberglass binder including a polyacid, such as polyacrylic acid, and a polyol, with a molecular weight less than about 1000, such as, for example, glycerol, triethanolamine, sorbitol, or ethylene glycol. A phosphorous catalyst is used to accelerate the cure of the composition.

U.S. Pat. No. 5,932,689 describes a curable aqueous composition for fiberglass insulation, which contains (a) a polyacid comprising at least two carboxylic acid groups, anhydride groups, or salts thereof; (b) an active hydrogen-containing compound, such as polyol or polyamine, and (c) a cyanamide, a dicyanamide or a cyanoguanidine. Suitable accelerators include phosphorous or fluoroborate salts.

WO 03/104284 describes an epoxide-type formaldehyde-free insulation binder containing a substantially infinitely water-dilutable or water-dispersable mixture of an epoxide and a multi-functional cross-linker, such as polyamidoamine polymer.

U.S. Pat. No. 5,006,140 discloses the use application of a water dispersion of a gelatinized starch sulphamate as a binder for glass wool. Such dispersions have the disadvantage that it is more difficult to spray them onto the fiber. The viscosity of the gelatinized starch is too high, so when used on wool, the composition has poor flowability. Also, the starch binder in the composition is merely gelated and does not chemically bond as a crosslinker to the resin.

Despite these disclosures, there is a growing need for new formaldehyde-free aqueous compositions suitable for use as a binder for fiberglass insulation. Some of the drawbacks and limitations of disclosed systems include high cost, high viscosity, low pH causing corrosion of metal parts of the production lines, and high cure temperature. Moreover, because fossil resources will be scarce in the future, there will be an increased need for binders made out of renewable resources. Thus, new formaldehyde-free binders having lower cost and using renewable materials would be desirable.

SUMMARY OF THE INVENTION

The present invention is drawn to a curable aqueous composition and methods for the preparation thereof, wherein the curable aqueous composition comprises an adduct of: (a) a carbohydrate polymer, and (b) a multi-functional crosslinking agent selected from a group consisting of monomeric polybasic acid, salt thereof, anhydride, and mixtures thereof, wherein the adduct is prepared in a process comprising combining (a) and (b) in a weight ratio of (a):(b) of from 95:5 to about 35:65.

The present invention is also drawn to bonded nonwoven products and methods for the preparation thereof, wherein the method comprises contacting nonwoven fibers with the curable aqueous composition to form a mixture, and heating the mixture from 120° C. to 300° C. for sufficient time to effect cure.

In addition, the present invention is drawn to agricultural/horticultural materials or building insulation materials comprising the bonded nonwoven product.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

The present invention relates to carbohydrate-based formaldehyde-free compositions. Particularly, the present invention relates to an aqueous fiberglass binder containing a substantially infinitely water-dilutable adduct of (a) a carbohydrate polymer and (b) a multi-functional crosslinking agent such as a polybasic acid, salt thereof, anhydride or a mixture thereof. The adduct is formed by combining (a) a carbohydrate polymer and (b) a multi-functional crosslinking agent in a weight ratio of (a):(b) being from 95:5 to about 35:65, and wherein the curable composition has a pH of at least 1.25. Preferably, the weight ratio of (a):(b) is from 80:20 to 45:55, and most preferably, the weight ratio of (a):(b) is from 65:35 to 50:50.

The (a) carbohydrate polymer has the advantage of being made from renewable carbohydrate raw materials. These include oligosaccharides and polysaccharides such as native starch derived from various plants (legumes, potatoes, corn, etc), crude starch-containing products derived from plants containing residues of proteins, polypeptides, lipids, and low molecular carbohydrates and monosaccharides; alginic acid, agar agar, carrageen, tragacanth, gum arabic, guar gum, xanthan, karaya, tara gum, pektin, locust bean gum, and the like.

Natural starches have approximately 20-30% of the starch in the amylose form (having coiled chains of glucose residues) with the balance of starch being amylopectin (having branched chains of glucose residues). Some starches can reach as high as 70% amylose (such as HYLON VII) while others are essentially 100% amylopectin, such as waxy cornstarch. It is preferred to use a starch having greater than 80% amylopectin due to the improved solubility resulting from the branched chains of glucose residues. Most preferred is to use a waxy starch having essentially 100% amylopectin.

Microbiologically produced oligosaccharides and polysaccharides can also be used, such as Levan (a high molecular weight water soluble polymer of fructose, from Montana Polysaccharides Corp.)

Several insoluble renewable raw materials can also be used, such as cellulose, glycogen, pullulan (derived from e.g. *Aerobasidium pullulans*), laminarin (from seaweed species), lichenin (lichens and mosses), chitin, chitosane, and the like. The (a) polymeric carbohydrates range in their relative solubility in aqueous solutions.

In the event that the (a) carbohydrate polymer is so insoluble as to make it impractical to prepare binder solutions, the solubility can be increased by solubilizing the (a) carbohydrate polymer in a hydrolysis reaction using acidic, oxidative or thermal means. Also, if the (a) carbohydrate polymer is an insoluble starch, the insoluble starch can be solubilized by enzyme catalyzed hydrolysis. The type of enzyme to hydrolyze the carbohydrate can be any known in the art, and is preferably pullanase ($\alpha$-dextrin endo-1,6-$\alpha$-glucosidase) and/or $\alpha$-amylase (1,4-$\alpha$-D-glucan-4-glucanohydrolase). It is preferred to solubilize the (a) carbohydrate polymer with a hydrolysis promoting acid. For this procedure, an organic or inorganic acid can be used. It is envisioned that the hydrolysis promoting acid is the same as the acids encompassed by (b) a multi-functional crosslinking agent as described herein. Using (b) a multifunctional crosslinking agent as the hydrolysis promoting acid saves a process step. In addition, the hydrolysis promoting acid can be any strong acid, but is preferably HCl, $H_2SO_4$, HBr, $H_3PO_4$, HF, $HNO_3$ and $HClO_4$. It is most preferred to use HCl. The concentration of the hydrolysis promoting acid is 0.4 to 6.0 N. Preferably, the concentration is 0.5 to 4.5 N. Most preferably, the concentration is 0.5 to 3.0 N.

In the embodiment wherein the hydrolysis promoting acid is not (b) a multifunctional crosslinking agent, the aqueous mixture can be neutralized with a base and filtered prior to the crosslinking reaction.

The (b) multi-functional crosslinking agent is combined with the (hydrolyzed or non-hydrolyzed) (a) carbohydrate polymer and the mixture is stirred until an adduct is formed. It is likely that the adduct includes ester linkages formed between (b) and (a). In order to speed up the adduct formation, it is preferred to raise the temperature to above room temperature. Preferably, the temperature is above the gelation temperature of the starch. More preferably, the temperature is 60° C. to 120° C. Most preferably, the temperature is 80° C. to 100° C.

The (b) multi-functional crosslinking agent includes maleic acid, succinic acid, citric acid, phthalic acid, glutaric acid, oxalic acid, adipic acid, tartaric acid, aspartic acid, malic acid and the like. The salts of said acids can be used as well. Alternatively, the carboxylic component can be an anhydride including maleic anhydride, succinic anhydride, phthalic anhydride and the like. Herein the term "multi-functional" means that the crosslinking agent effectively has more than one basic site per molecule thereby allowing for crosslinkage using its ability to bond at each of the multiple basic sites.

In an embodiment of the invention, the curable aqueous composition of this invention may optionally be neutralized with a base. In particular, the pH is adjusted with at least one base selected from the group consisting of a nitrogenous base, sodium hydroxide, and potassium hydroxide. It is preferred to use a nitrogenous base and it is especially preferred that the nitrogenous base is ammonium hydroxide or triethanolamine. The preferred pH for the curable aqueous composition is up to 6.0. More preferably, the pH for the curable aqueous composition is from about 2.5 to 6.5. Even more preferably, the range of pH is 3.5 to 5.0.

In an embodiment of the invention, other water soluble resins can be added to the curable aqueous composition. These resins include polyvinyl alcohol, acrylates, PF resins, PUF resins, UF resins, MF resins, MUF resins, alkydes, polyurethane resins and other polyesters. However, an advantage of the present invention is that the binder formed from the curable aqueous composition can be made with some, none or all of these resins. In one aspect, the curable aqueous composition can be made without essentially any polyvinyl alcohol.

The non-woven fiber is glass fiber, rock wool fiber, cellulose, hemp, wool, jute, polyester, acrylic, nylon, polyamide, and the like. As used herein, the term "glass fiber" is intended to embrace heat-resistant fibers suitable for withstanding elevated temperatures such as mineral fibers, aramid fibers, ceramic fibers, metal fibers, carbon fibers, polyimide fibers, rayon fibers, and especially glass fibers.

The curable aqueous composition can also include other components, e.g. emulsifiers, plasticizers, anti-foaming agents, biocide additives, anti-mycotics including, e.g., fungicides, adhesion promoting agents, colorants, waxes, antioxidants, corrosion inhibitors, fire retardants, mold inhibitors, hydrophobizers and combinations thereof.

In an embodiment of the invention, the formaldehyde-free curable aqueous composition of this invention may optionally contain cure accelerators (catalysts). The catalyst according to the present invention is selected from the group consisting of zinc chloride, zinc nitrate, ammonium chloride, ammonium sulphate, magnesium chloride, magnesium acetate, aluminum sulphate, aluminum chloride, sodium hypophosphite, sodium phosphite, and mixtures thereof.

In an embodiment of the invention, the viscosity of the curable aqueous composition is reduced to improve its suitability for some industrial applications. In these compositions, low molecular weight extenders/viscosity modifiers are added to improve processability of the binder. Any extender/viscosity modifier known in the art that is compatible with the curable aqueous composition can be used, but it is preferable to use low molecular weight polyols. The low molecular weight polyol is at least one selected from the group consisting of glucose, sucrose, sorbitol, glycerol, ethylene glycol, diethanolamine, triethanolamine, or the like. It is also envisioned to use additional water-soluble renewable materials, such as sugar alcohols or broken down natural polymers like dextrins as the extender/viscosity modifier. Preferably, the extender/viscosity modifier is used in an amount of 35 to 80 parts based on 100 parts (a) the carbohydrate polymer, and most preferably, the extender/viscosity modifier is used in an amount of 45 to 65 parts based on 100 parts (a) the carbohydrate polymer.

In an embodiment of the invention, the curable aqueous composition is prepared in a concentrated form hereinafter referred to as a "concentrated resin". The advantage to the inventive concentrated resin is that it is infinitely water dilutable and can be readily stored and shipped to an application site. The concentrated resin is diluted prior to curing, usually at the application site where it is combined with the fibers and then cured. Generically, both the concentrated resin form and the diluted resin form are herein referred to as the "curable aqueous composition".

The concentrated resin has a viscosity of below 100 mPas, preferably, below 75 mPas. The viscosity measurements described herein (unless otherwise noted) are determined according to standard EN ISO 3219 applying a shear rate of 200/s using a 30 wt % aqueous solution at 20° C. The concentrated resin is produced having a non-volatiles content of greater than 25 wt %. Preferably, the non-volatiles content is greater than 30 wt %, and most preferably, the non-volatiles content is 32 wt % to 43 wt % based on the weight of the concentrated resin composition. Immediately before the application to the fiber, it is diluted by water (and optionally, combined with other additives) to form the binder. Most preferably, the concentrated resin has a viscosity of below 50 mPas. Preferably, the diluted resin form comprises greater than 1% by weight of nonvolatiles immediately prior to curing. More preferably, the diluted resin form comprises 2 to 12% by weight of nonvolatiles immediately prior to curing. Most preferably, the diluted resin form comprises 3 to 6% by weight of nonvolatiles immediately prior to curing. Herein, the solid content (nonvolatiles) is measured by drying the sample for 1 hour at 135° C.

In an embodiment of the invention, the curable aqueous composition includes solvents other than water to promote intimate mixing of the components.

The curable aqueous composition of the invention can be used to prepare nonwoven products by a variety of methods known in the art, which, in general, involve the impregnation of a loosely assembled mass of fibers with the diluted curable aqueous solution to form a mat. The product can be used in agricultural/horticultural applications. Preferably the product is used in building insulation, a roofing fiberglass mat or a nonwoven filtration material.

For glass fiber products, the cured binder must provide a strong bond with sufficient elasticity and thickness recovery to permit reasonable shipping and in-service deformation. It also should be moisture resistant so that it does not collapse under humid conditions. Additionally, it should be odor free and non-corrosive to metals with which it comes in contact. The binder should be capable of withstanding temperatures approaching the temperatures that the glass fibers can withstand, particularly for pipe insulation where the pipeline is used for hot fluids.

Generally, fibers having a length of about ¼ inch to 3 inches and a diameter of about 3 to 20 microns are used in the wet-laid process (for example, roofing materials production).

Glass fibers typically used in manufacturing insulation products (that are produced using melt-blown technique) range in diameter from about 2 to 9 microns, and have a length of about ½ inch to 2 inches.

The particular method used for forming glass fibers for use in the present invention is relatively unimportant. Processes for making glass fiber products, especially glass fiber insulation products, using the curable aqueous composition of the present invention are typically carried out according to one of a number of methods wherein a molten mineral material flowing from a melting furnace is divided into streams and attenuated into fibers. The attenuation can be done by centrifuging and/or fluid jets to form discontinuous fibers of relatively small dimensions, which typically are collected by random depositing on a moving foraminous (porous) conveyor belt. The fibers are collected in a felted haphazard manner to form a mat or blanket. The volume of fiber in the mat or blanket will be determined by the speed of fiber formation and the speed of the belt.

Continuous glass fibers may also be employed in the form of mats or blankets fabricated by swirling the endless filaments or strands of continuous fibers, or they may be chopped or cut to shorter lengths for mat or blanket formation. Use can also be made of ultra-fine fibers formed by the attenuation of glass rods. Also, such fibers may be treated with a size, anchoring agent or other modifying agent before use.

Glass fiber products, including glass fiber insulation products, may also contain fibers that are not in themselves heat-resistant such as, for example, certain polyester fibers, rayon fibers, nylon fibers, and superabsorbent fibers, in so far as they do not materially adversely affect the performance of the product.

In order to produce most glass fiber products, including glass fiber insulation products, the fibers should be bonded together in an integral structure. To achieve this binding, the curable aqueous composition of the present invention is applied to the glass fiber mat or blanket. The layer of fiber with binder is then mildly compressed and shaped into the form and dimensions of the desired product. The glass fiber product, especially the glass fiber insulation product, then is passed through a curing oven where the binder is cured fixing the size and shape of the finished product.

The curable aqueous composition may be applied to the glass fibers by conventional techniques such as, for example, air or airless spraying, padding, saturating, roll coating, curtain coating, beater deposition, and coagulation. For example, the curable aqueous composition can be applied to the glass fibers by flooding the collected mat or blanket of glass fibers and draining off the excess, by applying the binder composition onto the glass fibers during mat or blanket formation, by spraying the glass fiber mat or the like. As noted above, the layer of fiber with binder is then mildly compressed and shaped into the form and dimensions of the desired glass fiber product, especially glass fiber insulation product, such as pipe, batt or board and passed through a curing oven where the binder is cured, thus fixing the size and shape of the finished product by bonding the mass of fibers one to another and forming an integral composite structure.

In an embodiment of the invention, is a method for forming a non-woven material comprising: mixing nonwoven fibers with the curable aqueous binder, and heating the binder and fibers at 120° C. to 300° C. for sufficient time to effect cure, usually 1-10 minutes. Preferably, the reaction is performed at a temperature between 130° C. and 250° C. for 2 to 9 minutes, and most preferably, the reaction is performed at a temperature between 150° C. and 215° C. for 2 to 7 minutes. It is envisioned that the fiber surface can be pretreated prior to application of the binder, e.g., with adhesion promoters, however, this is not preferred in view of the cost of this step.

On heating, the water present in the binder composition evaporates, and the binder composition undergoes curing. These processes can take place in succession or simultaneously. Curing in the present context is to be understood as meaning the chemical alteration of the composition, for example crosslinking through formation of covalent bonds between the various constituents of the composition, formation of ionic interactions and clusters, and/or formation of hydrogen bonds. Furthermore, the curing can be accompanied by physical changes in the binder, for example phase transitions or phase inversion.

As noted, the drying and curing functions may be accomplished in two or more distinct steps, if desired. For example, the composition may be first heated at a temperature and for a time sufficient to substantially dry but not to substantially cure the binder composition and then heated for a second time at a higher temperature and/or for a longer period of time to effect curing (crosslinking). Such a procedure, referred to as "B-staging", may be used to provide a binder-treated glass fiber product, such as a glass fiber insulation product, for example, in roll form, which may at a later stage be cured, with or without forming or molding into a particular configuration, concurrent with the curing process. This processing makes it possible, for example, to use the compositions of this invention for producing binder-impregnated semifabricates that can be molded and cured elsewhere.

Glass fiber products can be formed as a relatively thin product of about 0.25 to 1.5 inch or it can be a thick mat or blanket of 12 to 14 inches or more. The time and temperature for cure will depend in part on the amount of binder in the final structure and the thickness and density of the structure that is formed.

The glass fiber products, and particularly the glass fiber insulation products may be used for applications such as, for example, insulation batts or rolls, as reinforcing mat for roofing or flooring applications, as roving, as microglass-based substrate for preparing laminated printed circuit boards or battery separators, as filter stock, as tape stock, and as reinforcement scrim in cementitious and non-cementitious coatings for masonry.

Unless otherwise indicated, all concentrations in weight percent as described herein are based on the entire weight of the composition.

Example 1

Resin Preparation

To a 1-liter 3 necked flask equipped with a mechanical stirrer, reflux condenser, and thermometer were charged 190 g of water and 1 ml of 37% HCl. The solution was heated to 85° C. In a beaker, a slurry was prepared of 100 g waxy cornstarch and 190 g water. This slurry was slowly added to the HCl solution at a continuous mixing. The temperature was kept in the range of 83-85° C. After all starch was added, the liquid was mixed for 5 hours at 85° C. After that, it was cooled down to 60° C. To the mixture, 81 g of solid maleic anhydride, 38 g of glycerol, and 20 g of solid citric acid were added. The composition was stirred at 60° C. until crystals were dissolved, and then cooled down to 25° C. After that, the composition was neutralized by slow addition of ammonium hydroxide and then filtered. The neutralized resin composition was a clear, infinitely water-dilutable liquid with NV=31.1%, and pH=3.5.

Example 2

To a 1-liter 3 necked flask equipped with a mechanical stirrer, reflux condenser, and thermometer were charged 90 g of water and 1 g of maleic anhydride and the mixture was heated to 85° C. When the maleic anhydride was dissolved, a slurry of 71 g of waxy corn starch in 163 g of water was prepared and added slowly at a continuous mixing. The temperature was kept in the range of 83-85° C. After all starch was added, the liquid was mixed for 5 hours at 85° C. After that, it was cooled down to 40° C. To the mixture, 48 g of maleic anhydride, 23 g of glycerol, and 12 g of citric acid were added. The composition was stirred at 40° C. until crystals were dissolved, and then cooled down to 25° C. The pH was then adjusted to 4.0 with triethylamine. The neutralized resin had NV=37.5% and a viscosity less than 20 mPas.

Example 3

To a 1-liter 3 necked flask equipped with a mechanical stirrer, reflux condenser, and thermometer were charged 550 g of water and 3 g of maleic anhydride and the mixture was heated to 85° C. A dispersion of 315 g of waxy corn starch in 550 mL of water was prepared and added slowly to the maleic anhydride solution. After all starch was added, the liquid was mixed for 3 hours at 85° C. After that, 200 g of maleic anhydride and 50 g of citric acid were added. The liquid was then distilled under vacuum at 85° C. until it became clear. It was then cooled down to 40° C., and 50 g of sorbitol were added at continuous mixing. The pH was adjusted to 4.0 with ammonia. The solid content of this resin depends on the time of distillation. After 1 hour of distillation, the resin had NV=36.1 wt %. The viscosity remained below 20 mPas.

Example 4

In a beaker, a 40% aqueous slurry of water soluble starch (Aldrich, ACS-reagent) was prepared. In a separate beaker, a 40% aqueous solution of maleic acid was prepared. The maleic acid solution was then heated to 85° C. The starch slurry was added slowly to the acid solution while mixing. Mixing was continued at 85° C. until the liquid was clear.

After that, the liquid was cooled down to 25° C. and neutralized to pH 3.5 with ammonia. The neutralized resin had NV=37.2% and a viscosity less than 20 mPas.

Example 5

This example shows how to improve the solubility of the (a) carbohydrate polymer by enzymatic means. 74.5 g of waxy corn starch were admixed with 401.4 g of water to give a homogeneous suspension of which the pH is adjusted to the optimum pH for α-amylase derived from Bac. amyloliquefaciens. 1.75 mL of this α-amylase preparation, containing more or at least 250 units per mg were added to the suspension at room temperature (20-22° C.). The suspension was allowed to react at room temperature (20-22° C.) for 75 min. The temperature was elevated to 80-85° C. within 20 minutes and the mixture was diluted with an additional 401.4 g of water. 63.9 g of the PVOH preparation, 103.1 g of maleic acid anhydride, 25.8 g of citric acid, and 48.4 g glycerol were added and allowed to dissolve. The mixture was cooled to room temperature as ammonia (25%) was added to reach the final pH (see Table 1 below).

TABLE 1

| Characteristics of the Resin of Example 5 | |
|---|---|
| Solids (135° C./1 h) | 25.3% |
| pH | 4.3 |
| Water dilutability | Infinite |
| viscosity | 2 mPas |

Example 6

This example shows how to improve the solubility of the (a) carbohydrate polymer by enzymatic means. 74.5 g of waxy corn starch were admixed with 401.4 g of water to give a homogeneous suspension of which the pH is adjusted to the optimum pH for pullulanase derived from bac. acidopullulyticus. 874 µL of this pullulanase preparation, containing more or at least 400 units per mL were added to the suspension at the optimum temperature of this enzyme. The suspension was allowed to react for 60 min. The pH and the temperature were then adjusted to the optimum for an α-amylase derived from bac. amyloliquefaciens and 875 µL thereof were added to the mixture and allowed to react for 30 min. The temperature was then elevated to 80-85° C. within 25 min and the mixture was diluted with an additional 401.4 g of water. 63.9 g of the PVOH preparation, 103.1 g of maleic acid anhydride, 25.8 g of citric acid, and 48.4 g glycerol were added to the mixture and allowed to dissolve. The mixture was cooled to room temperature as ammonia (25%) was added to reach the final pH (see Table 2 below).

TABLE 2

| Characteristics of the Resin of Example 6 | |
|---|---|
| Solids (135° C./1 h) | 27.0% |
| pH | 4.4 |
| Water dilutability | Infinite |
| Viscosity | 10 mPas |

Example 7

25.5 g or Levan (high molecular weight, water soluble polymer of fructose; obtained from Montana Polysaccharides Corp.) were added slowly to 73 g of water and stirred until dissolved. 20.5 g or maleic anhydride were added and mixed until complete dissolution. 9.5 g of glycerol and 5 g of citric acid were then added and mixed for 5 minutes. The mixture was neutralized with aqua ammonia to pH of 4.0. This resulted in a resin having NV=36.1% and the viscosity below 10 mPas.

Example 8

This example shows the preparation of a resin composition having a high solid content prepared with potato starch.

To a 1-liter 3 necked flask equipped with a mechanical stirrer, reflux condenser, and thermometer were charged 186 g of water and 51.5 g of polyvinylalcohol (MOWIOL 3-85, purchased from Prochema). The mixture was heated to 60° C. and when the PVOH was completely dissolved, 83.3 g of maleic anhydride was added. As soon as the maleic anhydride was dissolved, 21 g of citric acid and 39 g of glycerol were added. The temperature was further increased to 85° C. 54.3 g of potato starch were added. The mixture was kept for an additional hour at 85° C. and then cooled down to 20° C. The mixture was partly neutralized by ammonia (25% in water). See Table 3 below for the resin characteristics.

TABLE 3

| Characteristics of the Resin | |
|---|---|
| Solids (135° C./1 h) | 50.2% |
| pH | 4.1 |
| Water dilutability | Infinite |
| viscosity | 312 mPas |

Example 9

737 kg of water were charged into a steel reactor at ambient temperature. Then 58.4 kg of polyvinylalcohol (MOWIOL 3-85, purchased from Prochema) were added under stirring and the temperature was raised to 60° C. As soon as all of the polyvinylalcohol was dissolved, 94.5 kg of maleic anhydride were added. When the anhydride dissolved, 23.6 kg of citric acid and 44.3 kg of glycerine were added. The temperature was raised to 85° C. At 80° C., 68.3 kg of waxy corn starch were added. The temperature drops, but the heating of the reactor continues to reach the desired temperature of 85° C. At 1.5 hours after starting the addition of the starch, the reactor was cooled to 25° C. At this temperature, the resin is partially neutralized with ammonia (25% in water). See Table 4 below for the resin characteristics.

TABLE 4

| Characteristics of the Resin | |
|---|---|
| Solids (135° C./1 h) | 27.5% |
| pH | 3.8 |
| Water dilutability | Infinite |
| viscosity | 8 mPas |

Example 10

Binder Preparation

A binder solution was prepared by adding a sufficient amount of resins of Examples 1-7 to water and mixing to form a 5.0 wt % solution. The binders were clear or slightly hazy liquids with pH 4.2-5.7.

Example 11

Tensile Testing of Cured Glass Fiber Specimens

Binders of Example 8 were applied to a glass fiber substrate as follows.

Glass paper (Whatman 934-AH) was soaked in the binder solution for 5 minutes, then the excess liquid was removed by vacuum. The samples were put into an oven at 180-200° C. for 5 minutes (see Table 5) for curing of the binder resin.

The cured samples were cut into specimens having the dimensions of 6"×1" and tested for dry tensile strength by placing them in the jaws of a Lloyd Instruments LRX Plus tensile tester. Samples were pulled apart at a crosshead speed of 2 inches/minute.

For wet tensile testing, the specimens were treated with hot water at 80° C. for 10 minutes, and then tested for tensile strength while still wet. Retention was calculated as a ratio Wet strength/Dry Strength. Retention is a measure of the degree of cure of a curable composition: higher retention indicates higher degree of cross-linking. The load in Kgf was measured at the break. The test results are presented in the Table 5.

TABLE 5

Tensile Strength of cured glass fiber specimens

| Binder formed with the Resin of ... | Temperature, ° C. | Dry strength, kgf | Wet strength, kgf | Retention, % |
|---|---|---|---|---|
| Example 1 | 180 | 4.6 | 1.4 | 30 |
| Example 1 | 200 | 3.8 | 2.7 | 71 |
| Example 2 | 180 | 4.1 | 0.8 | 20 |
| Example 2 | 200 | 4.5 | 1.7 | 38 |

As can be seen from the Table 5, higher temperatures resulted in higher wet strength and retention.

Example 12

Molten glass was dropped at a controlled rate into a rapidly spinning fiber disc having small holes. Centrifugal forces drove the glass out of the small holes thus creating fibers. As the fibers exited the fiber disc, a diluted aqueous solution of the resin described in Example 9 was sprayed onto them. The resinated fibers fell onto a conveyer belt which transported them through an oven. In this oven, hot air was blown through the resinated fibres to cure the resin, resulting in a nonwoven insulation product.

The conditions above were chosen to give an insulation board of 20 mm thickness and a density of 80 kg/m$^3$ was produced. Diluted aqueous resin with a concentration of 8.9% was sprayed onto the fibers. The average curing oven temperature was set to 185° C. The residual time in the oven was 3 minutes, 25 seconds. L.O.I. (Loss of Ignition) of the board produced was 5.6%, the compressive strength (DIN EN 826): 2.4±0.2 kPa.

Herein, % L.O.I. is measured in the following procedure. The sample is weighted into a dry platinum crucible with an accuracy of four digits. Thereupon the sample is carefully tempered by means of a Bunsen burner. No piece may fall out. Afterwards the sample is tempered again in a muffle furnace at 600° C. until constancy of weight. After allowing the sample to cooling to room temperature in a desiccator, the residue is weighted. The calculation of the % L.O.I. is %=[Output Weight (g)/Initial Weight (g)]×100.

Example 13

Similar to Example 12, a diluted aqueous resin of the resin described in Example 9 having a concentration of 8.6% was sprayed onto the fibers. A mat of 60 mm thickness and a density of 20 kg/m$^3$ was produced. The average curing oven temperature was set to 206° C. The residual time in the oven was 2 minutes 39 seconds. L.O.I. of the mat produced was 6.5%. The produced mat is classified (EN 13501-1) in the reaction to fire performance class A2-s1, d0.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A curable aqueous composition comprising an adduct of:
   (a) a carbohydrate polymer, and
   (b) a multi-functional crosslinking agent selected from a group consisting of monomeric polybasic acid, salt thereof, anhydride thereof, and mixtures thereof,
   wherein the adduct is prepared in a process comprising directly combining (a) and (b) in a weight ratio of (a):(b) of from 95:5 to about 35:65,
   wherein the cross-linking agent is selected from the group consisting of citric acid, maleic acid, maleic anhydride, succinic acid, glutaric acid, malic acid, phthalic acid, oxalic acid, adipic acid, tartaric acid, aspartic acid, phthalic anhydride, and mixtures thereof, and
   wherein the curable aqueous composition has a pH adjusted with a nitrogenous base.

2. The curable aqueous composition of claim 1, wherein said (a) carbohydrate polymer is a solubilized carbohydrate polymer.

3. The curable aqueous composition of claim 2, wherein said (a) carbohydrate polymer is starch.

4. The curable aqueous composition of claim 3, wherein said starch has more than 80% amylopectin.

5. The curable aqueous composition of claim 1, which contains essentially no polyvinyl alcohol.

6. The curable aqueous composition of claim 1, having a nonvolatile content greater than 30 wt %.

7. The curable aqueous composition of claim 1, further comprising adding water in an amount sufficient so the curable aqueous composition comprises up to 96% by weight of water based on the total weight of the composition.

8. A method of forming a curable aqueous composition comprising: combining
   (a) a carbohydrate polymer, and
   (b) a multi-functional crosslinking agent selected from a group consisting of
   monomeric polybasic acid, salt thereof, anhydride thereof, and mixtures thereof, and adjusting the pH of the curable aqueous composition with a nitrogenous base;
   wherein the weight ratio of (a):(b) is from 95:5 to about 35:65,
   wherein the cross-linking agent is selected from the group consisting of citric acid, maleic acid, maleic anhydride, succinic acid, glutaric acid, malic acid, phthalic acid, oxalic acid, adipic acid, tartaric acid, aspartic acid, phthalic anhydride, and mixtures thereof.

9. The method of claim 8, further comprising a step of solubilizing the (a) carbohydrate polymer with a hydrolysis promoting acid before the (a) carbohydrate polymer is combined with the (b) multi-functional crosslinking agent.

10. The method of claim 8, wherein the (a) carbohydrate polymer is starch and wherein said starch has greater than 80% amylopectin.

11. The method of claim 8, further comprising adding water in an amount sufficient so the curable aqueous composition comprises up to 96% by weight of water based on the total weight of the composition.

12. The method of claim 8, wherein the curable aqueous composition has a nonvolatile content greater than 30 wt %.

13. A method for bonding nonwoven fibers comprising:
contacting said nonwoven fibers with a curable aqueous composition as claimed in claim 7 to form a mixture, and heating the mixture from 120° C. to 300° C. for sufficient time to effect cure.

14. The method of claim 13, wherein the nonwoven fibers are fiberglass or mineral wool.

15. A bonded nonwoven product prepared in a process comprising:
contacting nonwoven fibers with the curable aqueous composition as claimed in claim 7 to form a mixture, and heating the mixture from 120° C. to 300° C. for sufficient time to effect cure.

16. The bonded nonwoven product of claim 15, wherein the nonwoven fibers are fiberglass.

17. Building insulation comprising the bonded nonwoven product of claim 16.

18. The curable aqueous composition of claim 1, wherein said pH is up to 6.

19. The curable aqueous composition of claim 1, wherein the adduct further comprises at least one selected from the group consisting of glucose, sucrose, sorbitol, glycerol, ethylene glycol, diethanolamine, triethanolamine, sugar alcohol and dextrin.

20. The curable aqueous composition of claim 1, further comprising a catalyst selected from the group consisting of zinc chloride, zinc nitrate, ammonium chloride, ammonium sulphate, magnesium chloride, magnesium acetate, aluminum sulphate, aluminum chloride, sodium hypophosphite, sodium phosphite, and mixtures thereof.

* * * * *